(12) United States Patent
    Mallikarjunaswamy

(10) Patent No.: US 10,211,199 B2
(45) Date of Patent: Feb. 19, 2019

(54) HIGH SURGE TRANSIENT VOLTAGE SUPPRESSOR

(71) Applicant: Alpha and Omega Semiconductor (Cayman) Ltd., Grand Cayman (KY)

(72) Inventor: Shekar Mallikarjunaswamy, San Jose, CA (US)

(73) Assignee: Alpha and Omega Semiconductor (Cayman) Ltd., Grand Cayman (KY)

( * ) Notice: Subject to any disclaimer, the term of this patent is extended or adjusted under 35 U.S.C. 154(b) by 0 days.

(21) Appl. No.: 15/718,567

(22) Filed: Sep. 28, 2017

(65) Prior Publication Data

US 2018/0286853 A1      Oct. 4, 2018

Related U.S. Application Data

(63) Continuation-in-part of application No. 15/605,662, filed on May 25, 2017, now Pat. No. 10,062,682, and a continuation-in-part of application No. 15/476,735, filed on Mar. 31, 2017.

(51) Int. Cl.
    *H01L 27/02*    (2006.01)
    *H01L 29/06*    (2006.01)
    *H01L 29/74*    (2006.01)

(52) U.S. Cl.
    CPC ...... *H01L 27/0262* (2013.01); *H01L 29/0649* (2013.01); *H01L 29/7408* (2013.01); *H01L 29/7412* (2013.01); *H01L 29/7424* (2013.01)

(58) Field of Classification Search
    CPC . H01L 27/0259; H01L 29/10; H01L 29/6609; H01L 29/861; H01L 27/0262; H01L 29/0649; H01L 29/7408; H01L 29/7412; H01L 29/7424
    See application file for complete search history.

(56) References Cited

U.S. PATENT DOCUMENTS

| | | |
|---|---|---|
| 7,538,997 B2 | 5/2009 | Mallikararjunaswamy |
| 7,554,839 B2 | 6/2009 | Bobde |
| 7,781,826 B2 | 8/2010 | Mallikararjunaswamy et al. |
| 7,795,987 B2 | 9/2010 | Bobde |
| 7,863,995 B2 | 1/2011 | Ho et al. |
| 7,880,223 B2 | 2/2011 | Bobde |
| 8,218,276 B2 | 7/2012 | Mallikararjunaswamy |
| 8,338,854 B2 | 12/2012 | Bobde et al. |
| 8,338,915 B2 | 12/2012 | Mallikararjunaswamy et al. |

(Continued)

*Primary Examiner* — Mohammed Shamsuzzaman
(74) *Attorney, Agent, or Firm* — Innovation Counsel LLP

(57) ABSTRACT

A bidirectional transient voltage suppressor is constructed as an NPN bipolar transistor incorporating optimized collector-base junction realizing avalanche mode breakdown. In some embodiments, the bidirectional transient voltage suppressor is constructed as an NPN bipolar transistor incorporating individually optimized collector-base and emitter-base junctions with the optimized junctions being spatially distributed. The optimized collector-base and emitter-base junctions both realize avalanche mode breakdown to improve the breakdown voltage of the transistor. Alternately, a unidirectional transient voltage suppressor is constructed as an NPN bipolar transistor with a PN junction diode connected in parallel in the reverse bias direction to the protected node and incorporating individually optimized collector-base junction of the bipolar transistor and p-n junction of the diode.

29 Claims, 9 Drawing Sheets

(56) References Cited

U.S. PATENT DOCUMENTS

| | | | |
|---|---|---|---|
| 8,698,196 B2* | 4/2014 | Guan | H01L 27/0255 257/173 |
| 9,520,486 B2* | 12/2016 | Coyne | H01L 27/0259 |
| 9,583,586 B1* | 2/2017 | Shi | H01L 29/66113 |
| 2004/0207021 A1* | 10/2004 | Russ | H01L 27/0262 257/355 |
| 2008/0218922 A1* | 9/2008 | Mallikararjunaswamy | H01L 27/0262 361/91.6 |
| 2009/0057716 A1* | 3/2009 | Rodrigues | H01L 27/0259 257/173 |
| 2010/0155774 A1* | 6/2010 | Tseng | H01L 29/87 257/173 |
| 2010/0276779 A1* | 11/2010 | Guan | H01L 27/0259 257/492 |
| 2012/0241903 A1* | 9/2012 | Shen | H01L 27/0255 257/510 |
| 2015/0123240 A1* | 5/2015 | Bowman | H01L 29/0688 257/506 |
| 2015/0138678 A1* | 5/2015 | Parthasarathy | H02H 9/005 361/56 |
| 2015/0364460 A1* | 12/2015 | Huang | H01L 27/0255 257/106 |
| 2016/0300827 A1* | 10/2016 | Vendt | H01L 27/0262 |
| 2017/0084601 A1* | 3/2017 | Yao | H01L 27/0255 |
| 2018/0090477 A1* | 3/2018 | Yin | H01L 21/02293 |

* cited by examiner

HIGH SURGE TRANSIENT VOLTAGE SUPPRESSOR

CROSS REFERENCE TO OTHER APPLICATIONS

This application is a continuation-in-part of U.S. patent application Ser. No. 15/605,662, entitled LOW CAPACITANCE BIDIRECTIONAL TRANSIENT VOLTAGE SUPPRESSOR, filed May 25, 2017, which application is incorporated herein by reference for all purposes; and is a continuation-in-part of U.S. patent application Ser. No. 15/476,735, entitled HIGH SURGE BI-DIRECTIONAL TRANSIENT VOLTAGE SUPPRESSOR, filed Mar. 31, 2017.

BACKGROUND OF THE INVENTION

Voltages and current transients are major causes of integrated circuit failure in electronic systems. Transients are generated from a variety of sources both internal and external to the system. For instance, common sources of transients include normal switching operations of power supplies, AC line fluctuations, lightning surges, and electrostatic discharge (ESD).

Transient voltage suppressors (TVS) are discrete devices commonly employed for protecting integrated circuits from damages due to the occurrences of transients or over-voltage conditions at the integrated circuit. Over-voltage protection are important for consumer devices or the Internet of Things devices as these electronic devices are exposed to frequent human handling and, as a result, may be susceptible to ESD or transient voltage events that may damage the devices.

In particular, the power supply pins and the data pins of the electronic devices both require protection from over-voltages conditions due to ESD events or switching and lightning transient events. Typically, the power supply pins needs high surge protection but can tolerate protection devices with higher capacitance. Meanwhile, the data pins, which may operate at high data speed, requires protection devices that provide surge protection with low capacitance as not to interfere with the data speed of the protected data pins.

Existing TVS protection circuits for high surge applications use vertical NPN or PNP bipolar transistor structures in open base configuration for bidirectional blocking. When a TVS is applied to protect the power line, it is important that the TVS has low leakage current. Leakage current through the TVS protection circuit may result in undesired power dissipation. Existing high surge TVS protection circuits decrease the leakage current by increasing the base doping level of the bipolar transistor. However, increased base doping decreases the gain of the bipolar transistor and compromises the clamping voltage due to lower bipolar injection efficiency.

BRIEF DESCRIPTION OF THE DRAWINGS

Various embodiments of the invention are disclosed in the following detailed description and the accompanying drawings.

DETAILED DESCRIPTION

Figure 1:
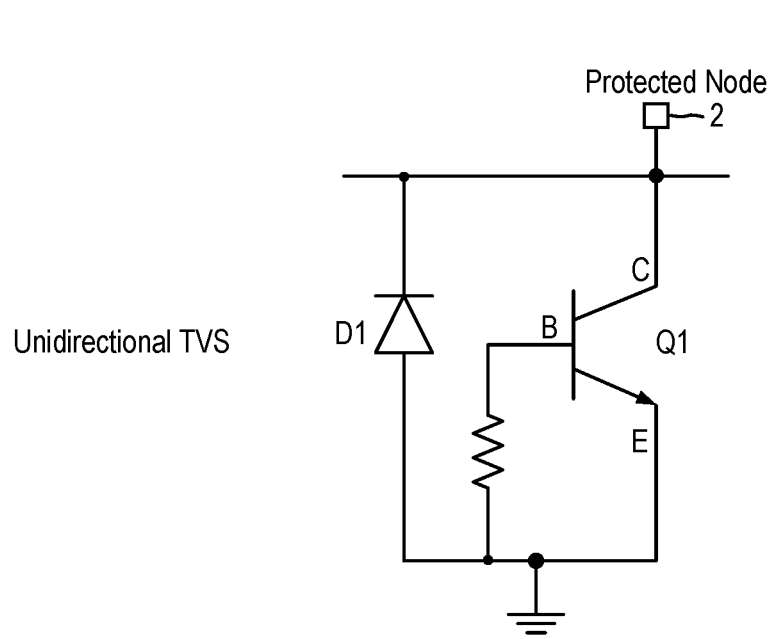
FIG. 1 is a circuit diagram of a unidirectional TVS protection device in embodiments of the present invention.

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

In embodiments of the present invention, a bidirectional transient voltage suppressor (TVS) includes an NPN bipolar transistor incorporating an optimized collector-base junction realizing avalanche mode breakdown. In an alternate embodiment, a bidirectional transient voltage suppressor (TVS) includes an NPN bipolar transistor incorporating individually optimized collector-base and emitter-base junctions with the optimized junctions being spatially distributed. The optimized collector-base and emitter-base junctions both realize avalanche mode breakdown to improve the breakdown voltage of the transistor. The NPN bipolar transistor is in an open base configuration with the base being resistively coupled to a PN junction diode connected in a reverse bias direction to the protected node. In some embodiments, the optimized collector-base junction interleaves the optimized emitter-base junction laterally in the semiconductor substrate. In this manner, the TVS device structure realizes an equivalent circuit of two parallelly connected NPN bipolar transistors that are individually optimized for positive zap voltages and negative zap voltages. The bidirectional TVS device of the present invention realizes bidirectional high surge protection with low leakage current and robust clamping voltage. Furthermore, the bidirectional TVS of the present invention realizes a tunable breakdown voltage to enable the breakdown voltage to be optimized for the electronic device to be protected.

In embodiments of the present invention, a unidirectional transient voltage suppressor (TVS) is constructed as a NPN bipolar transistor with a PN junction diode connected in parallel in the reverse bias direction to the protected node and incorporating individually optimized collector-base junction of the bipolar transistor and p-n junction of the diode. The NPN bipolar transistor is in an open base configuration with the base being resistively coupled to a reference potential and the anode of the PN junction diode is coupled to the reference potential. In this manner, the TVS device includes the NPN bipolar transistor and the PN junction diode that are individually optimized for positive zap voltages and negative zap voltages both with avalanche mode breakdown. The unidirectional TVS device of the present invention realizes high surge protection with low leakage current and robust clamping voltage. Furthermore, the unidirectional TVS of the present invention realizes a tunable breakdown voltage to enable the breakdown voltage to be optimized for the electronic device to be protected.

In the present description, a transient voltage suppressor (TVS) device refers to a protection device or protection circuit coupled to protect an integrated circuit node ("the protected node") from over-voltage transient conditions, such as voltage surges or voltage spikes. The TVS device operates by shunting the excess current from the protected node when a surge voltage exceeding the breakdown voltage of the TVS device is applied to the protected node. The TVS device typically operates by clamping the voltage at the protected node at a clamping voltage much lower than the voltage value of the voltage surge while safely conducting away the surge current.

A TVS device can be either a unidirectional device or a bidirectional device. A unidirectional TVS device has an asymmetrical current-voltage characteristic and is typically used for protecting circuit nodes whose signals are unidirectional—that is, the signals are always above or below a certain reference voltage, such as ground. For example, a unidirectional TVS device may be used to protect a circuit node whose normal signal is a positive voltage from 0V to 5V. On the other hand, a bidirectional TVS device has a symmetrical current-voltage characteristic and is typically used for protecting circuit nodes whose signals are bidirectional or can have voltage levels both above and below the reference voltage, such as ground. For example, a bidirectional TVS device may be used to protect a circuit node whose normal signal varies symmetrically above and below ground, such as from −12V to 12V. In this case, the bidirectional TVS protects the circuit node from a surge voltage that goes below −12 V or above 12V.

In operation, the TVS device is in a blocking mode and is non-conductive except for possible leakage current when the voltage at the protected node is below the breakdown voltage of the TVS device, sometimes referred to as a reverse standoff voltage. That is, when the voltage at the protected node is within the operating voltage range for the protected node, the TVS device is non-conductive and is in the blocking mode except for a low leakage current. In the event of a voltage transient, the TVS device enters the conductive mode and clamps the voltage at the protected node while conducting the current associated with the voltage transient.

In one example, the electronic device to be protected has an operating voltage of 5V and the TVS device is constructed to have a breakdown voltage of 6 to 7.5V. Accordingly, a voltage at the protected node exceeding the breakdown voltage of 6 to 7.5V will trigger the TVS device to conduct current from the protected node while clamping the voltage at the operated node at the clamping voltage. In embodiments of the present invention, the breakdown voltage of the TVS device can be tuned to accommodate the operating voltage values of the electronic device to be protected.

In embodiments of the present invention, the unidirectional or bidirectional TVS device of the present invention is coupled to a protected node of an electronic device to provide system-level surge protection to the electronic device. In the present description, the protected node can be the power lines or power pins of the electronic device as well as the data pins or input-output (I/O) pins of the electronic device. In one example, the TVS device of the present invention is coupled to the power lines or power pins of the electronic device at the printed circuit board level or at the connector of the electronic device as the protected node. In another example, the TVS device provides high surge protection in accordance with the International Electrotechnical Commission standard IEC 610004-5 which specifies high surge protection against a surge pulse of 8 us rise time and 20 us pulse width.

FIG. 1 is a circuit diagram of a unidirectional TVS protection device in embodiments of the present invention.

Referring to FIG. 1, a unidirectional TVS protection device ("TVS device") 1 is constructed as an NPN bipolar junction transistor Q1 connected in parallel with a PN junction diode D1 in a reverse bias direction. The collector of the NPN transistor Q1 is connected to the protected node 2 while the emitter of the NPN transistor Q1 is connected to a reference potential, typically the ground potential. The NPN transistor Q1 is in an open base configuration but the base of the NPN transistor is biased resistively to the ground potential. Meanwhile, the PN junction diode D1 has an anode connected to the ground potential and a cathode connected to the protected node 2. The protected node 2 can be a power supply node or a data pin or an I/O pin of an electronic device coupled thereto.

Figure 2:
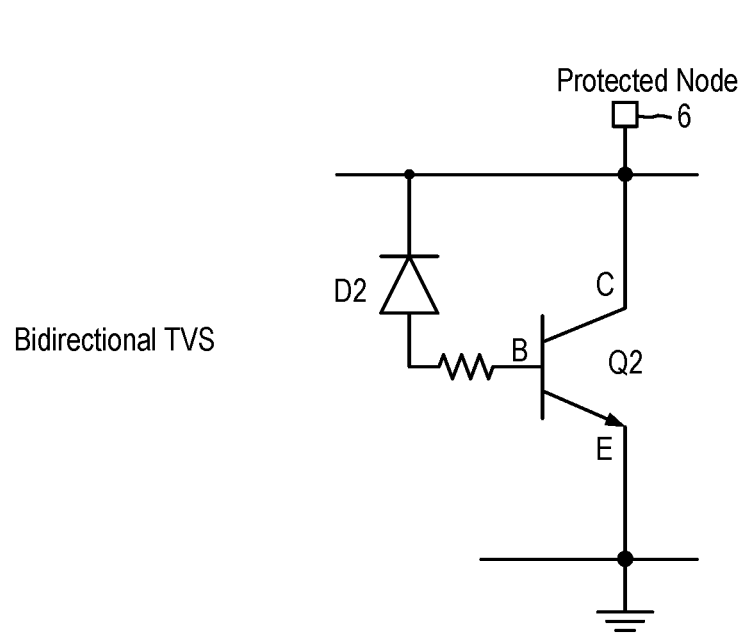
FIG. 2 is a circuit diagram of a bidirectional TVS protection device in embodiments of the present invention.

FIG. 2 is a circuit diagram of a bidirectional TVS protection device in embodiments of the present invention. Referring to FIG. 2, a bidirectional TVS protection device ("TVS device") 5 is constructed as an NPN bipolar junction transistor Q2 in an open base configuration with the base being resistively coupled to a PN junction diode connected in a reverse bias direction to the protected node. The collector of the NPN transistor Q2 is connected to the protected node 6 while the emitter of the NPN transistor Q2 is connected to a reference potential, typically the ground potential. The base of the NPN bipolar transistor Q2 is coupled resistively to the anode of the PN junction diode D2 and the cathode of the diode D2 connected to the protected node 6. The protected node 6 can be a power supply node or a data pin or an I/O pin of an electronic device coupled thereto. In embodiments of the present invention, the collector-base junction and the emitter-base junction of the bipolar transistor Q2 are individually optimized and spatially distributed to reduce the breakdown voltage trigger of the NPN bipolar transistor in the forward zap direction (positive zap) and reverse zap direction (negative zap).

It is instructive to note that bipolar transistor structure used to form the TVS device of the present invention is symmetrical in nature and that the collector and emitter terminals are interchangeable. The use of collector and emitter designation to refer to certain electrodes or terminals of the TVS device is illustrative only and not intended to be limiting. In particular, the TVS device may be subjected to positive or negative transient at the protected node and the TVS device may respond to the positive or negative polarity transient as if the bipolar transistor terminals are reversed.

Figure 3:
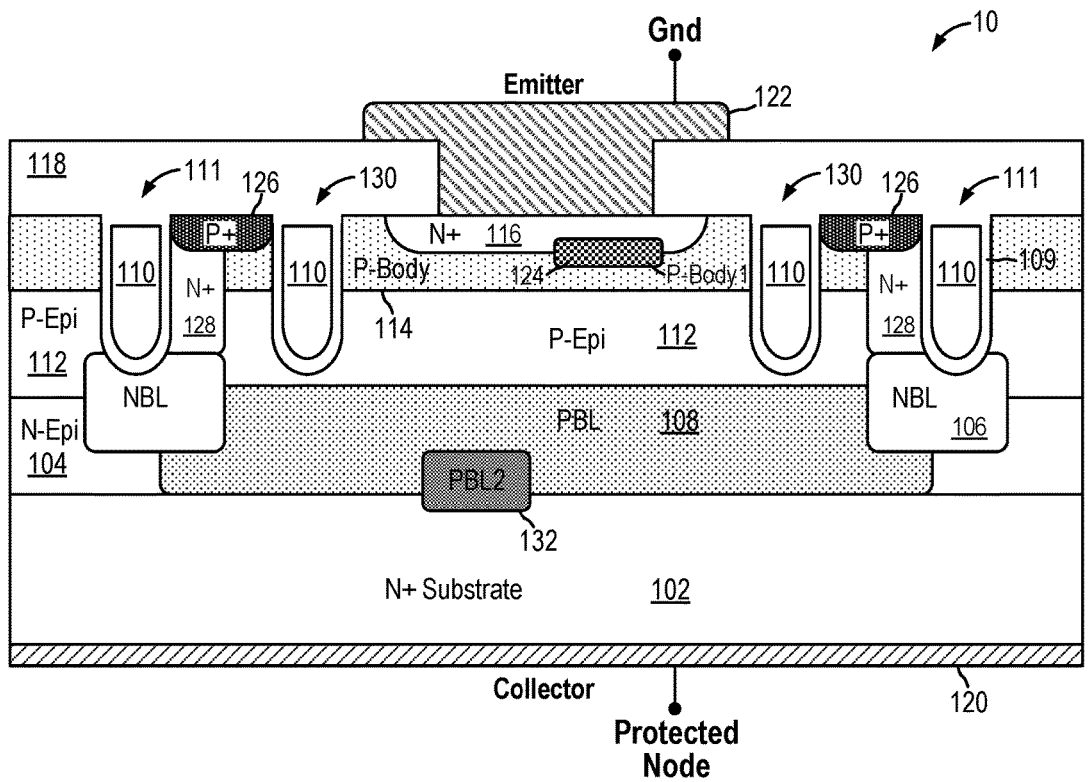
FIG. 3, which includes
Figure 3A:
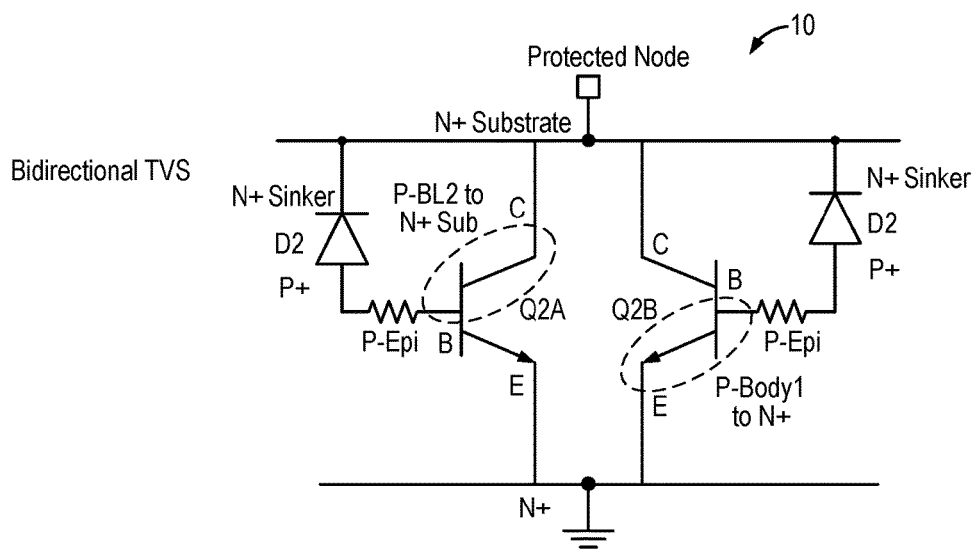
FIG. 3a, is a cross-sectional view of a bidirectional TVS device with spatially distributed and individually optimized collector-base and emitter-base junctions according to a first embodiment of the present invention.

FIG. 3, which includes FIG. 3a, is a cross-sectional view of a bidirectional TVS device with spatially distributed and individually optimized collector-base and emitter-base junctions according to a first embodiment of the present invention. Referring to FIG. 3, a bidirectional TVS device 10 ("TVS device 10") is formed on a heavily doped N+ substrate 102. A lightly doped N-type epitaxial layer 104 ("N-Epi layer 104") is formed on the N+ substrate 102. An N-type buried layer (NBL) 106 and a P-type buried layer (PBL) 108 are formed on the N-Epi layer 104. The P-type buried layer 108 is formed in a central portion or an active area of the TVS device while the N-type buried layer 106 is formed around an outer perimeter of the P-type buried layer 108 as an isolation barrier. In some embodiment, the N-type buried layer 106 is formed using a heavy N-type dopant, such as Antimony (Sb) and the P-type buried layer 108 is formed using Boron (B). Therefore, the P-buried layer 108 may be formed at a deeper junction depth than the N-buried layer 106.

A lightly doped P-type epitaxial layer 112 ("P-Epi layer 112") is formed on the N-type epitaxial 104 and the N and P-type buried layers 106, 108. A P-body region 114 is formed in the P-type epitaxial layer 112, such as by using ion implantation and drive-in. The P-body region 114 is more heavily doped than the P-type epitaxial layer 112. A heavily doped N+ region 116 is formed in the P-body region 114 to complete the NPN bipolar transistor.

As thus formed, the TVS device 10 is constructed as an NPN bipolar transistor including a collector formed by the N+ substrate 102, a base formed by the P-buried layer 108, the P-type epitaxial layer 112, and the P-body region 114, and an emitter formed by the N+ region 116. A dielectric layer 118 is formed over the semiconductor structure to cover and protect the semiconductor device. An opening is formed in the dielectric layer 118 and an emitter electrode 122 is formed in the opening for making an ohmic contact with the N+ region 116. A collector electrode 120 for making electrical contact with the N+ substrate 102 is also formed on the backside of the substrate. The emitter electrode 122 and the collector electrode 120 are typically formed of conductive materials, such as metal layers. In embodiments of the present invention, the collector electrode 120 and the emitter electrode 122 are interchangeable and may be referred to as first and second electrodes of the TVS device.

In the present illustration, TVS device 10 is isolated by trench isolation structure 111 so that an array of identical TVS devices can be formed on the substrate or the TVS device can be formed with other devices to realize the desired protection circuit for the integrated circuit. In the present embodiment, a trench 111 extending to the N-type buried layer 106 is formed to isolate TVS device 10 and the trench is lined with an oxide layer 109 and filled with a polysilicon layer 110. In other embodiments, an oxide filled trench isolation structure can be used. In FIG. 3, two trench isolation structures 111 are shown on either side of the TVS device. In actual implementation, the trench isolation structure 111 may be a single trench isolation structure encircling the central portion or the active area of the TVS device.

The TVS device 10 further includes N+ sinker regions 128 to connect the N-buried layer 106 to a heavily doped P+ region 126 formed at the surface of the semiconductor structure. The P+ region 126 is left floating, or not electrically connected to or biased to any electrical potential. By using the N+ sinker region 128, the collector-base junction breakdown is brought up to the surface of the semiconductor structure at junction between the N+ sinker 128 and the P+ region 126. In particular, the N+ sinker to P+ junction determines the breakdown voltage in the forward zap direction with the protected node 120 is biased more positively than the reference node 122, which is the ground potential in the present embodiment. In FIG. 3, two N+ sinkers 128 and P+ regions 126 are shown on either side of the TVS device. In actual implementation, the N+ sinker 128 and P+ region 126 may be a single structure encircling the central portion or the active area of the TVS device.

In TVS device 10, the N+ sinker region 128 are formed on the perimeter of the TVS device and additional trench isolation structures 130 are used to isolate the N+ sinker regions 128 from the active area of the TVS device, as defined by the N+ region 116. The trench isolation structures 130 are used to stop lateral injection from the N+ sinker/P+ junction into the emitter-base region of the TVS device. In the present embodiment, the trench isolation structures 130 are poly filled trenches with a dielectric sidewall. In other embodiments, the trench isolation structures 130 can be oxide filled trenches. In yet another embodiment, instead of using trench isolation, the lateral isolation can be accomplished by increasing the distance between the N+ sinker 128 and the N+ region 116. The use of trench isolation structures 130 is optional and may be omitted in other embodiments. Furthermore, the trench isolation structures 130 can be formed as a single trench isolation structure encircling the inner portion of the active area of the TVS device.

Furthermore, in TVS device 10, a buried P-body junction is formed by a P-body 1 region 124 formed at the junction of the N+ region 116 and the P-body region 114. The P-body 1 region 124 is more heavily doped than the P-body region 114 and is formed as an island of doped region at the N+/P-body junction. In some embodiments, the P-body 1 region 124 is formed by implantation of P-type dopants at the junction depth followed by annealing. The P-body 1 region 124 has the effect of pushing the breakdown of the N+ to P-body junction to occur at the buried junction, instead of at the surface of the semiconductor structure. Breakdown that occurs at or near the surface of the semiconductor structure is often not well controller. However, breakdown that occurs at a buried junction, such as the N+ to P-body 1 junction, can be better controlled and is thus more desirable.

In operation, the N+ to P-body 1 buried junction determines the breakdown voltage in the blocking mode in the reverse zap direction when the protected node 120 is biased more negatively than the reference node 122 (the ground potential), which is equivalent to the reference node 122 being biased more positively than the protected node 120. The P-body 1 region 124 is used to initiate the breakdown to force the breakdown to occur at the buried N+/P-body 1 junction. Meanwhile, the injection efficiency is improved by the lightly doped P-body region 114 outside of the P-body 1 region. That is, the P-body region 114 is more lightly doped than the P-body 1 region 124 and the injection efficiency is improved at the buried junction formed by the more lightly doped P-body region 114 and the N+ region 116. Once breakdown is initiated, the N+ to P-body junction will sustain the breakdown action.

In the TVS device 10, the breakdown voltage is determined by collector-base junction—that is, the spacing between the N+ substrate 102 and the P-buried layer 108 and the doping concentration of the substrate and the P-buried layer. In the present embodiment, TVS device 10 includes a P-type doped region 132 formed at the junction of the P-type buried layer 108 and the N+ substrate 102. In one embodiment, the P-type doped region 132 is formed as a P-type buried layer region, denoted as PBL2 region. The PBL2 region 132 is more heavily doped than the P-type buried layer 108 and is formed as an island of doped region at the PBL 108 and N+ substrate junction. By providing the PBL2 region with increased P-type doping, the avalanche breakdown characteristics of the collector-base junction is improved and the breakdown voltage of the TVS device in the forward zap direction is reduced.

As thus configured, the TVS device 10 includes an NPN bipolar transistor with individually optimized collector-base junction and emitter-base junction. More specifically, the TVS device 10 includes the PBL2 region 132 to optimize the collector-base junction of the transistor and includes P-body 1 region 124 to optimize the emitter-base junction of the transistor. A salient feature of the TVS device 10 is that the optimized collector-base and emitter-base junctions are spatially distributed in the active area of the TVS device. In the embodiment shown in FIG. 3, the PBL2 region 132 is formed spaced apart from the P-body 1 region 124 laterally so that the two regions do not align in the vertical direction from the top of the semiconductor structure to the bottom. As a result of spatially distributing the two optimization regions, the TVS device 10 forms an equivalent circuit of two parallelly connected NPN bipolar transistors that are individually optimized for positive and negative zap transient voltages.

FIG. 3a illustrates the equivalent circuit of the TVS device 10 shown in FIG. 3. Referring to FIG. 3a, the TVS device 10 can be viewed as a parallel connection of an NPN bipolar transistor Q2A and an NPN bipolar transistor Q2B. Each bipolar transistor has its base resistively coupled through the P-Epi layer and the P-Body region 114 to the P+ region 126 being the anode of the diode D2. The cathode of the diode D2 is formed by the N+ sinker 128 and is connected to the protected node through the N-type buried layer 106 and the N+ substrate 102. Bipolar transistor Q2A has its collect-base junction optimized by the PBL2 region 132 where the PBL2 region and N+ substrate junction determines the breakdown voltage of the TVS device in the forward zap direction—that is, the protected node being more positive relative to the reference node or ground. Meanwhile, bipolar transistor Q2B has its emitter-base junction optimized by the P-body 1 region 124 where the P-body 1 region and N+116 junction determines the breakdown voltage of the TVS device in the reverse zap direction—that is, the protected node being more negative relative to the reference node or ground. As a result of the spatial separation of the PBL2 region 132 and the P-body 1 region 124, the TVS device 10 operates as a pair of parallelly connected bipolar transistors with individually optimized breakdown voltage characteristics designed to enhance individually the forward and reverse zap characteristics.

In alternate embodiments of the present invention, the TVS device of FIG. 3 may incorporate only the PBL2 region 132 to optimize the collector-base junction of the NPN bipolar transistor of the TVS device.

Figure 4:
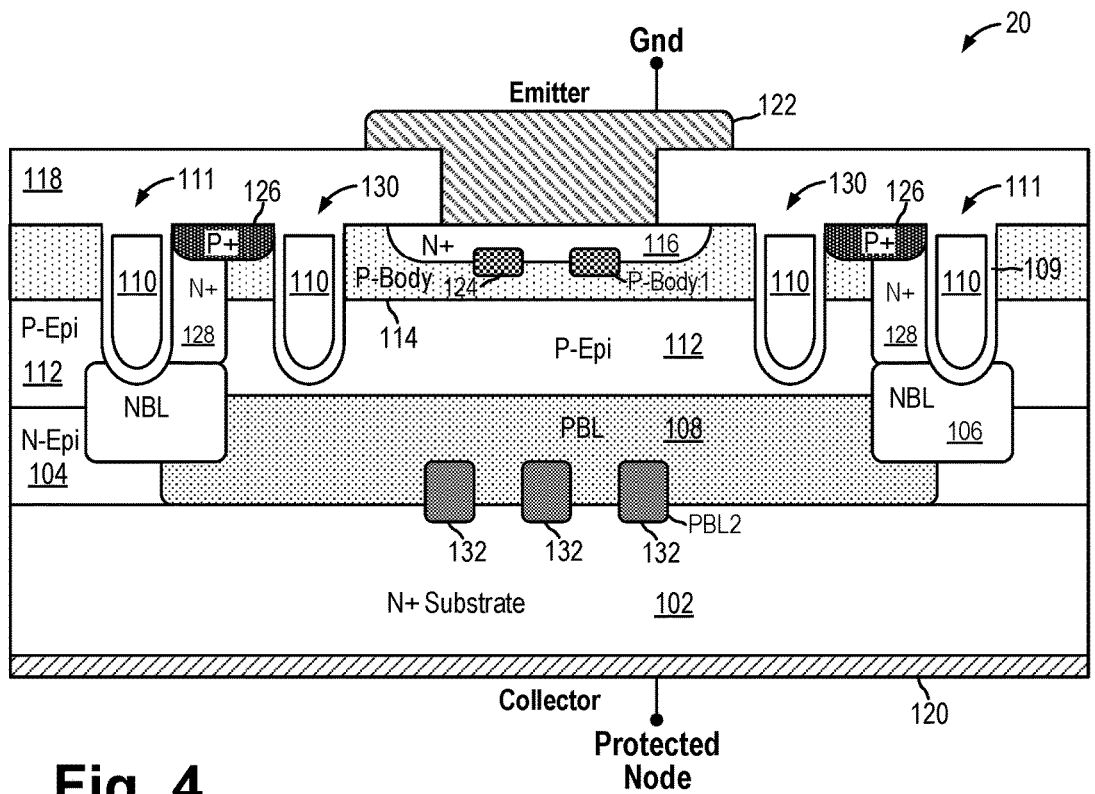
FIG. 4 is a cross-sectional view of a bidirectional TVS device with spatially distributed and individually optimized collector-base and emitter-base junctions according to a second embodiment of the present invention.

FIG. 4 is a cross-sectional view of a bidirectional TVS device with spatially distributed and individually optimized collector-base and emitter-base junctions according to a second embodiment of the present invention. Referring to FIG. 4, a TVS device 20 is constructed in the same manner as the TVS device 10 of FIG. 3 except for the formation of the P-body 1 region and the PBL2 region. In the TVS device 10 of FIG. 3, a single P-body 1 region and a single PBL2 region is used with the two regions spaced apart from each other. In the TVS device 20 of FIG. 4, the buried P-body junction is formed by multiple P-body 1 regions 124 formed at the junction of the N+ region 116 and the P-body region 114. The P-body 1 regions 124 are more heavily doped than the P-body region 114 and are formed as islands of doped regions dispersed at the N+/P-body junction. In some embodiments, the P-body 1 regions 124 are arranged in a strip pattern at the N+/P-body junction. Meanwhile, the PBL2 region is formed by multiple PBL2 regions 132 at the junction of the P-type buried layer 108 to N+ substrate 102. The PBL2 regions 132 are more heavily doped than the P-type buried layer 108 and are formed as islands of doped region dispersed at the PBL/N-substrate junction. In some embodiments, the PBL2 regions 132 are arranged in a strip pattern at the PBL/N-substrate junction.

Figure 5:
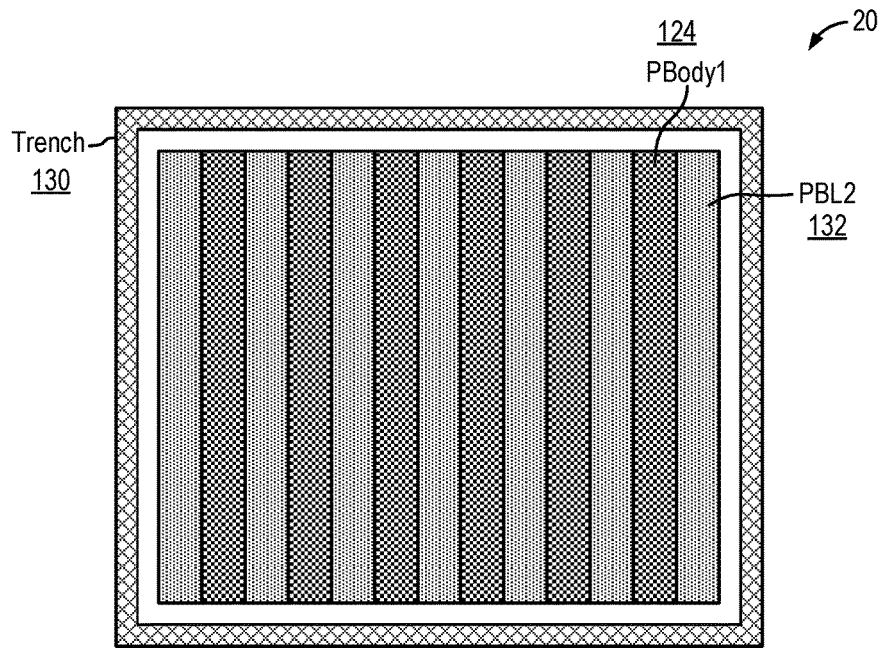
FIG. 5 is a top view of a portion of the TVS device of FIG. 4 in some embodiments.

In embodiments of the present invention, the P-body 1 regions 124 and the PBL2 regions 132 are spatially distributed from each other. In particular, in the present embodiment, the P-body 1 regions 124 and the PBL2 regions 132 are formed interleaving or alternating with one another. In actual implementation, the P-body 1 regions 124 and the PBL2 regions 132 may be configured using various shapes to form the spatially distributed interleaved structure. FIG. 5 is a top view of a portion of the TVS device 20 of FIG. 4 in some embodiments. Referring to FIG. 5, the TVS device 20 includes an active area encircled by the trench isolation structure 130. The PBL2 regions 132 and the P-body 1 regions 124 are formed as alternating strips within the active area. As thus configured, the individually optimized collector-base junction and emitter-base junction are formed interleaved and spatially distributed across the active area of the TVS device.

Figure 6:
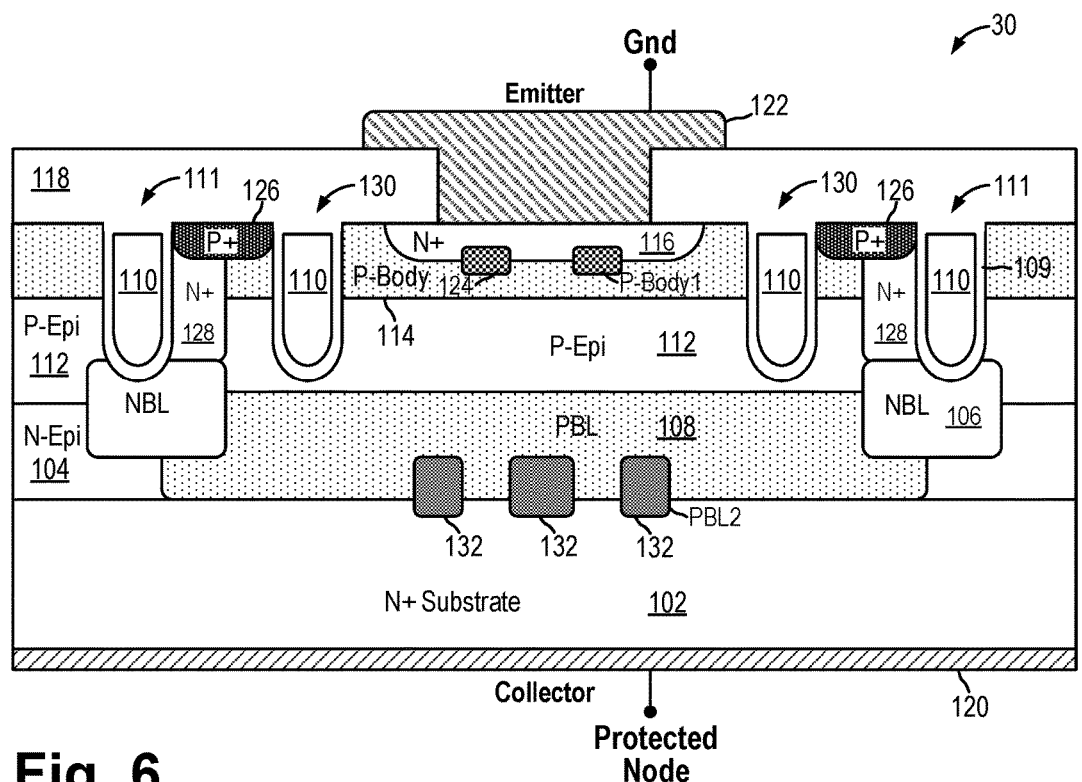
FIG. 6 is a cross-sectional view of a bidirectional TVS device with spatially distributed and individually optimized collector-base and emitter-base junctions according to a third embodiment of the present invention.
Figure 7:
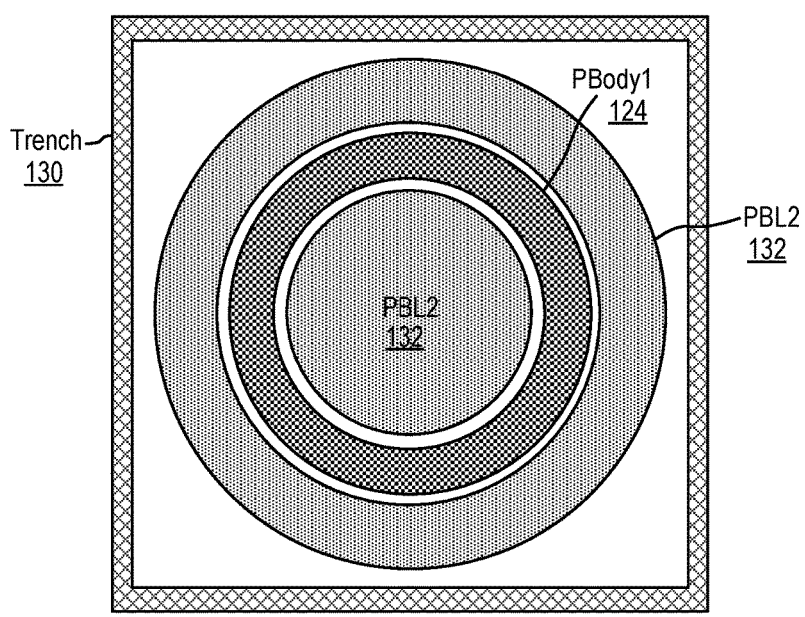
FIG. 7 is a top view of a portion of the TVS device of FIG. 6 in some embodiments.

FIG. 6 is a cross-sectional view of a bidirectional TVS device with spatially distributed and individually optimized collector-base and emitter-base junctions according to a third embodiment of the present invention. Referring to FIG. 6, a TVS device 30 is constructed in the same manner as the TVS device 20 of FIG. 4 except for the formation of the P-body 1 region and the PBL2 region. In the TVS device 30 of FIG. 6, the P-body 1 region 124 and the PBL2 regions 132 are formed interleaved in concentric circles, as shown in FIG. 7. FIG. 7 is a top view of a portion of the TVS device 30 of FIG. 6 in some embodiments. Referring to FIG. 7, the TVS device 30 includes an active area encircled by the trench isolation structure 130. The PBL2 regions 132 and the P-body 1 regions 124 are formed as concentric circles within the active area. In particular, the PBL2 region 132 form an inner circle and is encircled by the P-body 1 region 124, which is then encircled by a second PBL2 region 132. As thus configured, the individually optimized collector-base junction and emitter-base junction are formed interleaved and spatially distributed across the active area of the TVS device.

Figure 8:
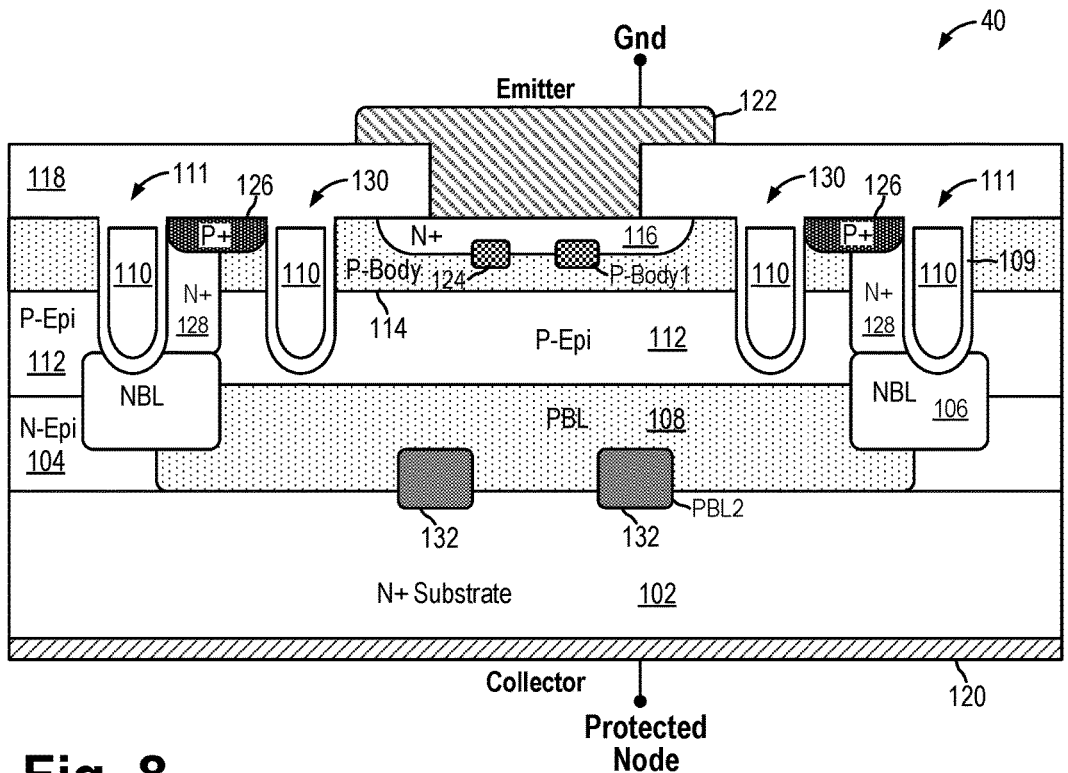
FIG. 8 is a cross-sectional view of a bidirectional TVS device with spatially distributed and individually optimized collector-base and emitter-base junctions according to a fourth embodiment of the present invention.
Figure 9:
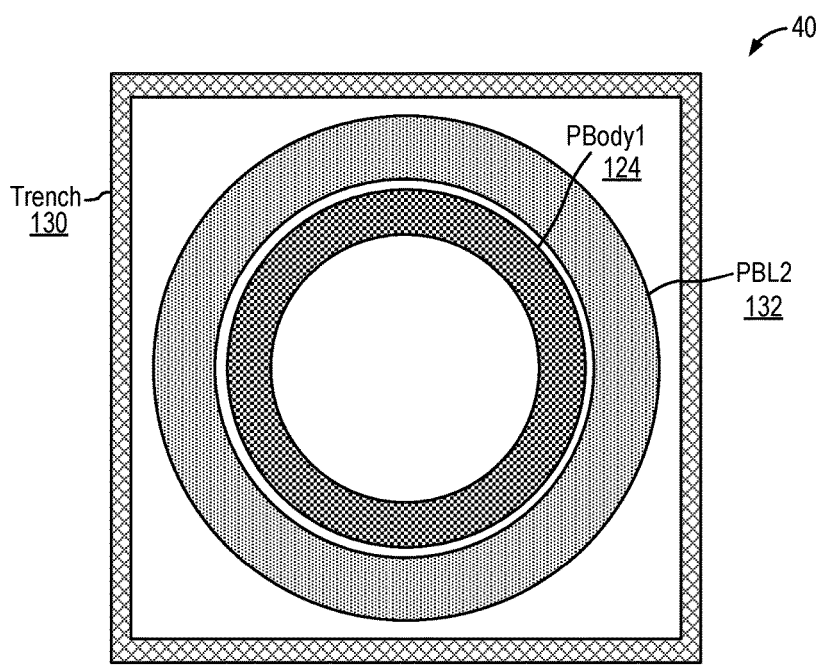
FIG. 9 is a top view of a portion of the TVS device 40 of FIG. 8 in some embodiments.

FIG. 8 is a cross-sectional view of a bidirectional TVS device with spatially distributed and individually optimized collector-base and emitter-base junctions according to a fourth embodiment of the present invention. Referring to FIG. 8, a TVS device 40 is constructed in the same manner as the TVS device 30 of FIG. 6 except for the formation of the P-body 1 region and the PBL2 region. In the TVS device 40 of FIG. 8, the P-body 1 region 124 and the PBL2 regions 132 are formed interleaved in concentric circles, as shown in FIG. 9. FIG. 9 is a top view of a portion of the TVS device 40 of FIG. 8 in some embodiments. Referring to FIG. 9, the TVS device 40 includes an active area encircled by the trench isolation structure 130. The PBL2 regions 132 and the P-body 1 regions 124 are formed as concentric circles within the active area. In the present embodiment, the P-body 1 region 124 form an inner ring, which is then encircled by a PBL2 region 132. As thus configured, the individually optimized collector-base junction and emitter-base junction are formed interleaved and spatially distributed across the active area of the TVS device.

Figure 10:
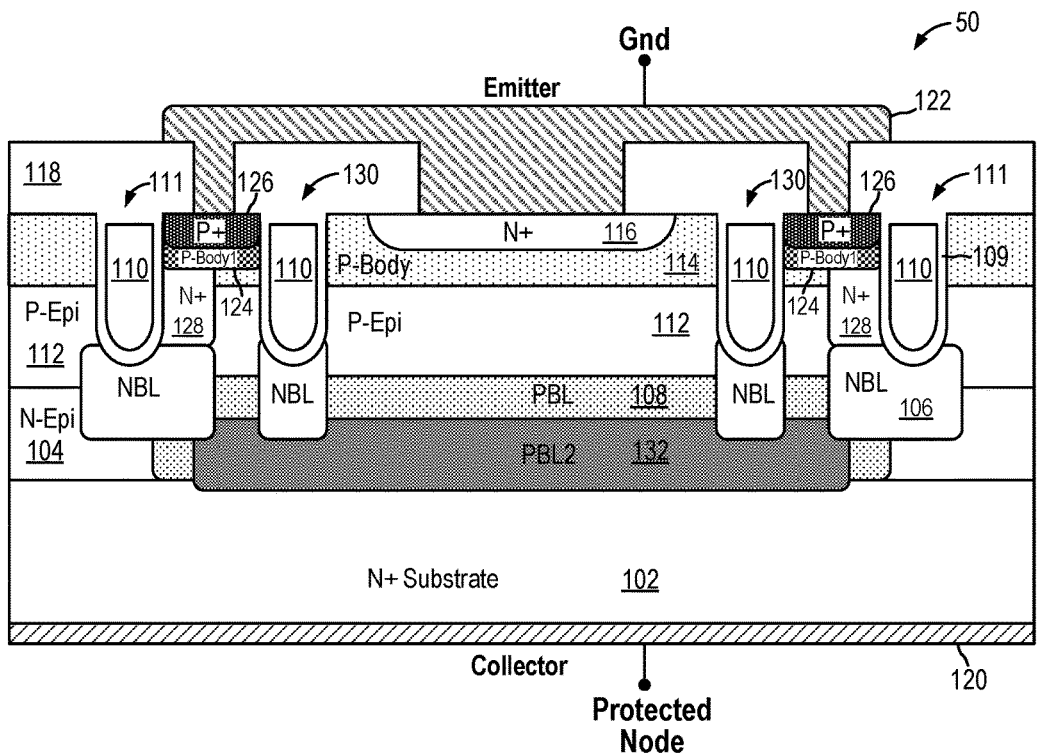
FIG. 10, which includes
Figure 10A:
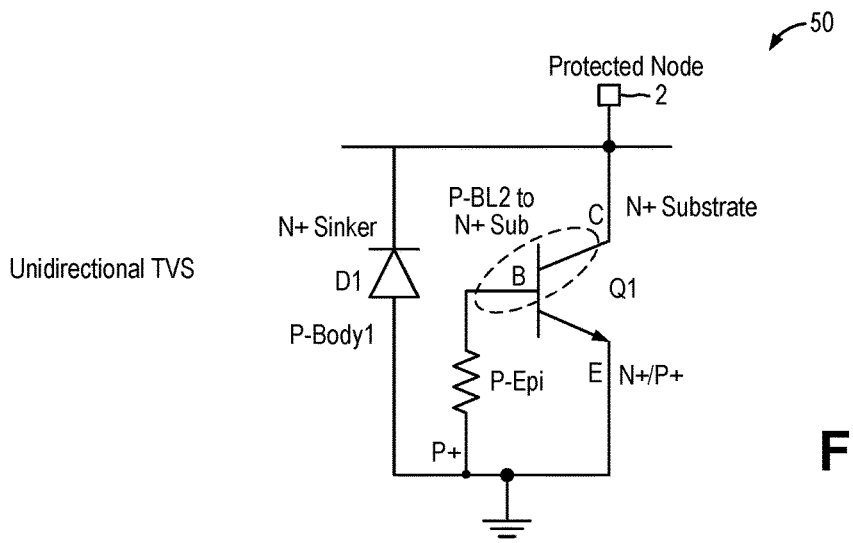
FIG. 10a, is a cross-sectional view of a unidirectional TVS device with individually optimized collector-base junction and p-n junction according to a first embodiment of the present invention.

FIG. 10, which includes FIG. 10a, is a cross-sectional view of a unidirectional TVS device with individually optimized collector-base junction and p-n junction according to a first embodiment of the present invention. Referring to FIG. 10, a unidirectional TVS device 50 ("TVS device 50") is formed on a heavily doped N+ substrate 102. A lightly doped N-type epitaxial layer 104 ("N-Epi layer 104") is formed on the N+ substrate 102. An N-type buried layer (NBL) 106 and a P-type buried layer (PBL) 108 are formed on the N-Epi layer 104. The P-type buried layer 108 is formed in a central portion or an active area of the TVS device while the N-type buried layer 106 is formed around an outer perimeter of the P-type buried layer 108 as an isolation barrier. In some embodiment, the N-type buried layer 106 is formed using a heavy N-type dopant, such as Antimony (Sb) and the P-type buried layer 108 is formed using Boron (B). Therefore, the P-buried layer 108 may be formed at a deeper junction depth than the N-buried layer 106.

A lightly doped P-type epitaxial layer 112 ("P-Epi layer 112") is formed on the N-type epitaxial 104 and the N and P-type buried layers 106, 108. A P-body region 114 is formed in the P-type epitaxial layer 112, such as by using ion implantation and drive-in. The P-body region 114 is more heavily doped than the P-type epitaxial layer 112. A heavily doped N+ region 116 is formed in the P-body region 114 to complete the NPN bipolar transistor.

As thus formed, the TVS device 50 is constructed as an NPN bipolar transistor including a collector formed by the N+ substrate 102, a base formed by the P-buried layer 108, the P-type epitaxial layer 112, and the P-body region 114, and an emitter formed by the N+ region 116. A dielectric layer 118 is formed over the semiconductor structure to cover and protect the semiconductor device. An opening is formed in the dielectric layer 118 and an emitter electrode 122 is formed in the opening for making an ohmic contact with the N+ region 116. A collector electrode 120 for making electrical contact with the N+ substrate 102 is also formed on the backside of the substrate. The emitter electrode 122 and the collector electrode 120 are typically formed of conductive materials, such as metal layers.

In the present illustration, TVS device 50 is isolated by trench isolation structure 111 so that an array of identical TVS devices can be formed on the substrate or the TVS device can be formed with other devices to realize the desired protection circuit for the integrated circuit. In the present embodiment, a trench 111 extending to the N-type buried layer 106 is formed to isolate TVS device 50 and the trench is lined with an oxide layer 109 and filled with a polysilicon layer 110. In other embodiments, an oxide filled trench isolation structure can be used. In FIG. 10, two trench isolation structures 111 are shown on either side of the TVS device. In actual implementation, the trench isolation structure 111 may be a single trench isolation structure encircling the central portion or the active area of the TVS device.

The TVS device 50 further includes N+ sinker regions 128 to connect the N-buried layer 106 to a heavily doped P+ region 126 formed at the surface of the semiconductor structure. The P+ region 126 is electrically connected to the emitter potential, such as by connected to the emitter electrode 122 through a contact opening in the dielectric layer 118. That is, the P+ region 126 is electrically shorted to the N+ region 116 with both being connected to the emitter potential. By using the N+ sinker region 128, the collector-base junction breakdown is brought up to the surface of the semiconductor structure at junction between the N+ sinker 128 and the P+ region 126. In particular, the N+ sinker to P+ junction determines the breakdown voltage in the forward zap direction with the protected node 120 is biased more positively than the reference node 122, which is the ground potential in the present embodiment. In FIG. 10, two N+ sinkers 128 and P+ regions 126 are shown on either side of the TVS device. In actual implementation, the N+ sinker 128 and P+ region 126 may be a single structure encircling the central portion or the active area of the TVS device.

In TVS device 50, the N+ sinker region 128 are formed on the perimeter of the TVS device and additional trench isolation structures 130 are used to isolate the N+ sinker regions 128 from the active area of the TVS device, as defined by the N+ region 116. The trench isolation structures 130 are used to stop lateral injection from the N+ sinker/P+ junction into the emitter-base region of the TVS device. In the present embodiment, the trench isolation structures 130 are poly filled trenches with a dielectric sidewall. In other embodiments, the trench isolation structures 130 can be oxide filled trenches. Furthermore, in the present embodiment, additional N-type buried layer regions 106 are formed under the trench isolation structures 130. In the present embodiment, the N-type buried layer regions 106 extend partially through the P-type buried layer 108. In yet another embodiment, instead of using trench isolation, the lateral isolation can be accomplished by increasing the distance between the N+ sinker 128 and the N+ region 116. Furthermore, the trench isolation structures 130 and the N-type buried layer regions 106 formed thereunder can be formed using a single trench isolation structure encircling the inner portion of the active area of the TVS device.

Furthermore, in TVS device 50, a buried P-body junction is formed by a P-body 1 region 124 formed in the P-body region 114 and at the junction of the P+ region 126 and the N+ sinker 128. The P-body 1 region 124 is more heavily doped than the P-body region 114 but less heavily doped than the P+ region 126. In some embodiments, the P-body 1 region 124 is formed by implantation of P-type dopants at the junction depth followed by annealing. In the unidirectional TVS device 50, the P+/P-body 1 region and the N+ sinker form the PN junction diode. In operation, the N+ sinker to P-body 1 buried junction determines the breakdown voltage in the blocking mode in the reverse zap direction when the protected node 120 is biased more negatively than the reference node 122 (the ground potential), which is equivalent to the reference node 122 being biased more positively than the protected node 120.

In the TVS device 50, the breakdown voltage is determined by collector-base junction—that is, the spacing between the N+ substrate 102 and the P-buried layer 108 and the doping concentration of the substrate and the P-buried layer. In the present embodiment, TVS device 50 includes a P-type doped region 132 formed at the junction of the P-type buried layer 108 and the N+ substrate 102. In one embodiment, the P-type doped region 132 is formed as a P-type buried layer region, denoted as PBL2 region. The PBL2 132 is more heavily doped than the P-type buried layer 108 and is formed across the entire active area region between the trench isolation structures 111. In the present embodiment, the PBL2 132 is formed at a deeper junction depth than the P-type buried layer 108. By providing the PBL2 layer 132 with increased P-type doping, the avalanche breakdown characteristics of the collector-base junction is improved and the breakdown voltage of the TVS device in the forward zap direction is reduced.

As thus configured, the TVS device 50 includes an NPN bipolar transistor and a PN junction diode with individually optimized collector-base junction of the bipolar transistor and the p-n junction of the PN junction diode. More specifically, the TVS device 50 includes the PBL2 layer 132 to optimize the collector-base junction of the transistor and includes P-body 1 region 124 to optimize the p-n junction of the PN junction diode. As a result, the TVS device 50 forms an equivalent circuit of an NPN bipolar transistor and a PN junction diode that are individually optimized for positive and negative zap transient voltages.

FIG. 10a illustrates the equivalent circuit of the TVS device 50 shown in FIG. 10. Referring to FIG. 10a, the TVS device 50 can be viewed as a parallel connection of an NPN bipolar transistor Q1 and a PN junction diode D1. The bipolar transistor Q1 has its base resistively coupled through the P-Epi layer and the P-Body region 114 to the P+ region 126 and to the emitter electrode which is connected to the ground potential. The anode of the diode D1 is formed by the P-body 1 region 124 and the P+ region 126 which is connected to the emitter electrode which is connected to the ground potential. The cathode of the diode D1 is formed by the N+ sinker 128 and is connected to the protected node through the N-type buried layer 106 and the N+ substrate 102. Bipolar transistor Q1 has its collect-base junction optimized by the PBL2 region 132 where the PBL2 region and N+ substrate junction determines the breakdown voltage of the TVS device in the forward zap direction—that is, the protected node being more positive relative to the reference node or ground. Meanwhile, the p-n junction formed by P-body 1 region and the N+ sinker determines the breakdown voltage of the TVS device in the reverse zap direction—that is, the protected node being more negative relative to the reference node or ground. As a result, the TVS device 50 operates as a parallel connection of a bipolar transistor and a PN junction diode with individually optimized breakdown voltage characteristics designed to enhance individually the forward and reverse zap characteristics.

Figure 11:
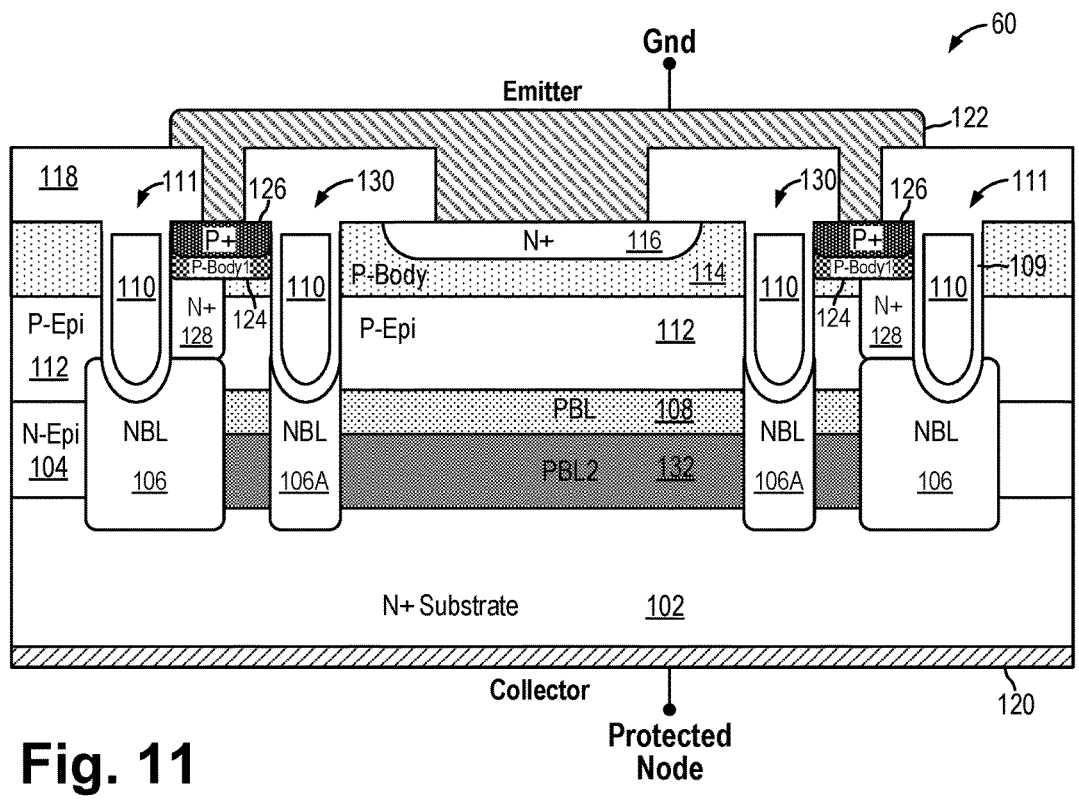
FIG. 11 is a cross-sectional view of a unidirectional TVS device with individually optimized collector-base junction and p-n junction according to a second embodiment of the present invention.

FIG. 11 is a cross-sectional view of a unidirectional TVS device with individually optimized collector-base junction and p-n junction according to a second embodiment of the present invention. Referring to FIG. 11, a TVS device 60 is constructed in the same manner as the TVS device 50 of FIG. 10 except for the formation of the N-type buried layer and the trench isolation structures. In the TVS device 50 of FIG. 10, the N-type buried layer 106 extends only partially through the P-type buried layer 108. In the TVS device 60 of FIG. 11, the N-type buried layer 106 and the trench isolation structures 130 are extended through the P-type buried layer 108 and PBL2 132 to completely isolate the active area of the bipolar transistor of the TVS device. As thus configured, the bipolar transistor active area is formed between the trench isolation structure 130 and the N-type buried layer portions 106A. The N-type buried layer portions 106A completely isolates the active area of the NPN bipolar transistor from the PN junction diode which is formed between the isolation structures 111 and 130. Even though portions of the PBL and PBL2 may be present in the PN junction diode area between the isolation structures 111 and 130, the PBL and PBL2 regions between the isolation structures 111 and 130 are dummy regions and do not contribute to the device operation of the TVS device 60.

Figure 12:
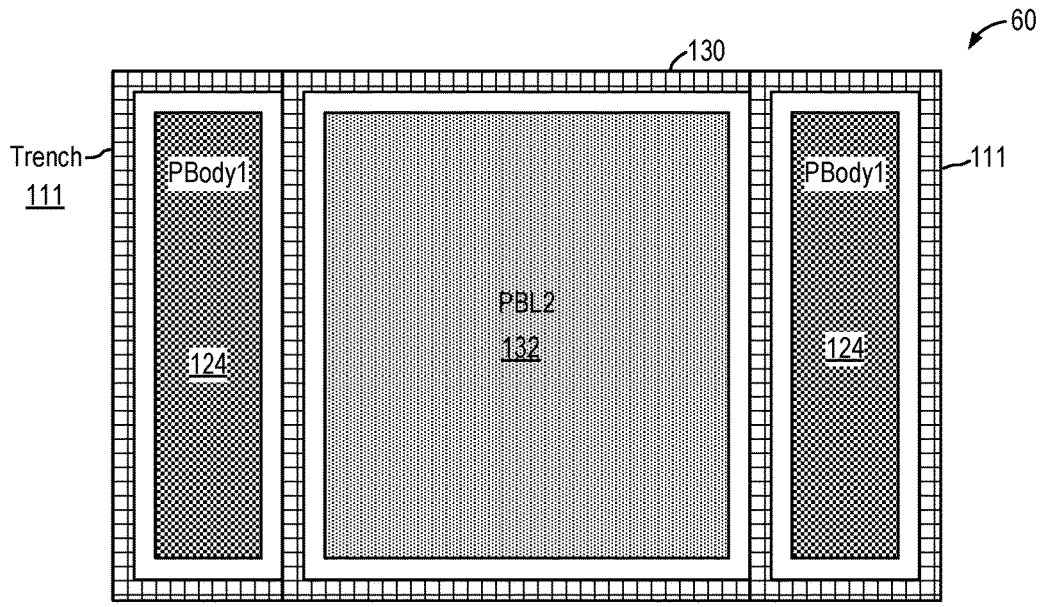
FIG. 12 is a top view of a portion of the TVS device 60 of FIG. 11 in some embodiments.

FIG. 12 is a top view of a portion of the TVS device 60 of FIG. 11 in some embodiments. Referring to FIG. 12, the TVS device 60 includes a transistor active area encircled by the trench isolation structure 130. The PBL2 region 132 is formed within and covers the transistor active area. The TVS device 60 further includes a diode active area formed between the trench isolation structures 130 and 111 and encircled by the trench isolation structure 111. The P-body 1 region 124 is formed within the diode active area and covers the diode active area. As thus configured, the individually optimized collector-base junction and p-n junction are formed in respective active area of the TVS device to optimize the bipolar transistor and the PN junction diode individually.

Figure 13:
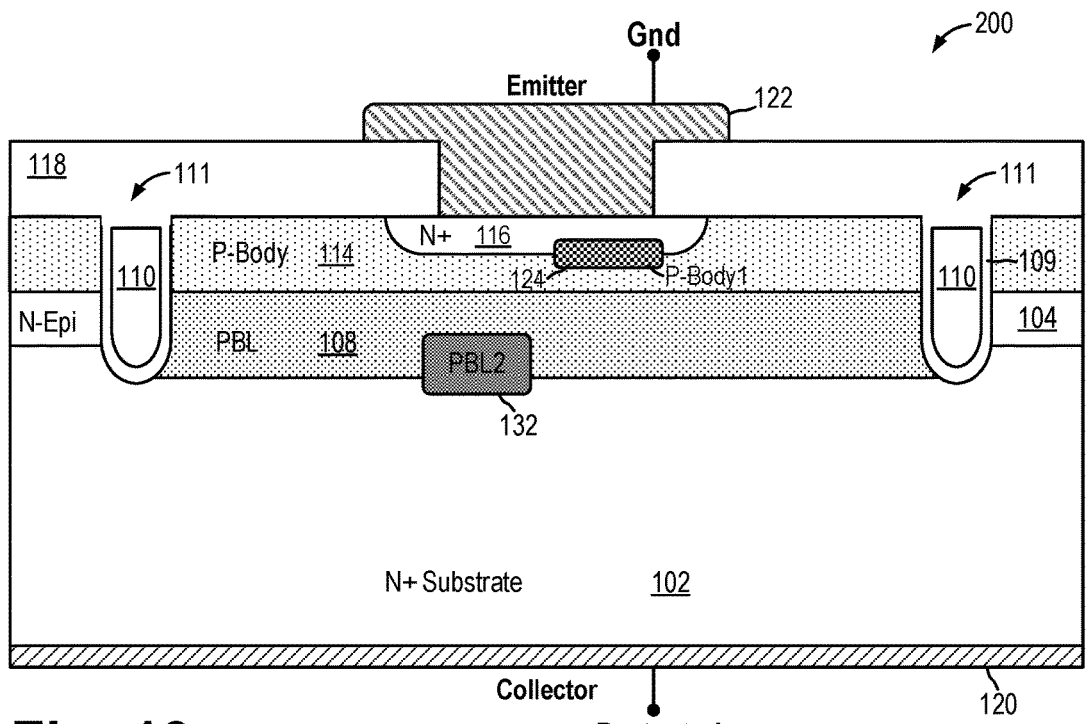
FIG. 13 is a cross-sectional view of a bidirectional TVS device with spatially distributed and individually optimized collector-base and emitter-base junctions according to a fifth embodiment of the present invention.

FIG. 13 is a cross-sectional view of a bidirectional TVS device with spatially distributed and individually optimized collector-base and emitter-base junctions according to a fifth embodiment of the present invention. FIG. 13 illustrates the construction of the TVS device 10 of FIG. 3 without using a P-type epitaxial layer. Referring to FIG. 13, a bidirectional TVS device 200 ("TVS device 200") is formed on a heavily doped N+ substrate 102. A lightly doped N-type epitaxial layer 104 ("N-Epi layer 104") is formed on the N+ substrate 102. A P-type buried layer (PBL) 108 is formed on the N-Epi layer 104. The P-type buried layer 108 is formed in a central portion or an active area of the TVS device. A P-body region 114 is formed in the N-type epitaxial layer 104 above the PBL 108. A heavily doped N+ region 116 is formed in the P-body region 114 to complete the NPN bipolar transistor.

As thus formed, the TVS device 200 is constructed as an NPN bipolar transistor including a collector formed by the N+ substrate 102, a base formed by the P-buried layer 108 and the P-body region 114, and an emitter formed by the N+ region 116. A dielectric layer 118 is formed over the semiconductor structure to cover and protect the semiconductor device. An opening is formed in the dielectric layer 118 and an emitter electrode 122 is formed in the opening for making an ohmic contact with the N+ region 116. A collector electrode 120 for making electrical contact with the N+ substrate 102 is also formed on the backside of the substrate. The emitter electrode 122 and the collector electrode 120 are typically formed of conductive materials, such as metal layers.

In the present illustration, TVS device 200 is isolated by trench isolation structure 111. In the present embodiment, a trench 111 extends to the N+ substrate 102 to isolate TVS device 200 and the trench is lined with an oxide layer 109 and filled with a polysilicon layer 110. In other embodiments, an oxide filled trench isolation structure can be used. In FIG. 13, two trench isolation structures 111 are shown on either side of the TVS device. In actual implementation, the trench isolation structure 111 may be a single trench isolation structure encircling the central portion or the active area of the TVS device.

In TVS device 200, a buried P-body junction is formed by a P-body 1 region 124 formed at the junction of the N+ region 116 and the P-body region 114. The P-body 1 region 124 is more heavily doped than the P-body region 114 and is formed as an island of doped region at the N+/P-body junction. TVS 200 further includes a P-type doped region 132 formed at the junction of the P-type buried layer 108 and the N+ substrate 102. In one embodiment, the P-type doped region 132 is formed as a P-type buried layer region, denoted as PBL2 region. The PBL2 region 132 is more heavily doped than the P-type buried layer 108 and is formed as an island of doped region at the PBL 108 and N+ substrate junction. The P-body 1 region 124 and the PBL2 region 132 are spatially distributed. As a result of spatially distributing the two optimization regions, the TVS device 200 forms an equivalent circuit of two parallelly connected NPN bipolar transistors that are individually optimized for positive and negative zap transient voltages.

In the present embodiment, the TVS device 200 is illustrated as being formed from a single P-body 1 region and a single PBL2 region. In other embodiments, the TVS device 200 can be formed using multiple interleaved P-body 1 and PBL2 regions, in the same manner as described above with reference to FIGS. 4-9.

Figure 14:
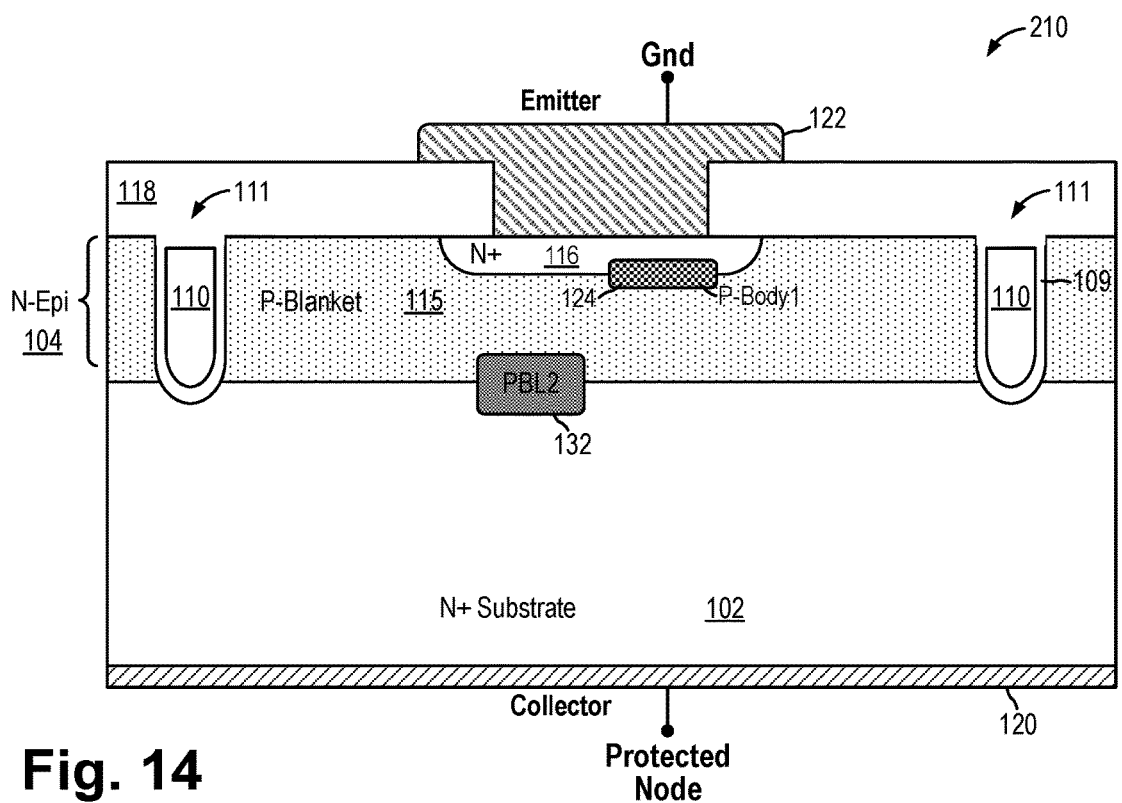
FIG. 14 is a cross-sectional view of a bidirectional TVS device with spatially distributed and individually optimized collector-base and emitter-base junctions according to a sixth embodiment of the present invention.

FIG. 14 is a cross-sectional view of a bidirectional TVS device with spatially distributed and individually optimized collector-base and emitter-base junctions according to a sixth embodiment of the present invention. Referring to FIG. 14, a TVS device 210 is constructed in the same manner as the TVS device 200 of FIG. 13 except for the formation of the P-type buried layer and the P-body region. In the TVS device 200 of FIG. 13, separate P-type buried layer 108 and P-body region 114 are formed. In the TVS device 210 of FIG. 14, a blanket P-type layer 115 can be used to replace the separate PBL and P-body layers. The blanket P-type layer 115 can be a blanket doped region formed on the entire surface of the N-type Epitaxial layer 104. The remaining structures of the TVS device 210 can be formed in the same manner as described above with reference to FIG. 13.

Figure 15:
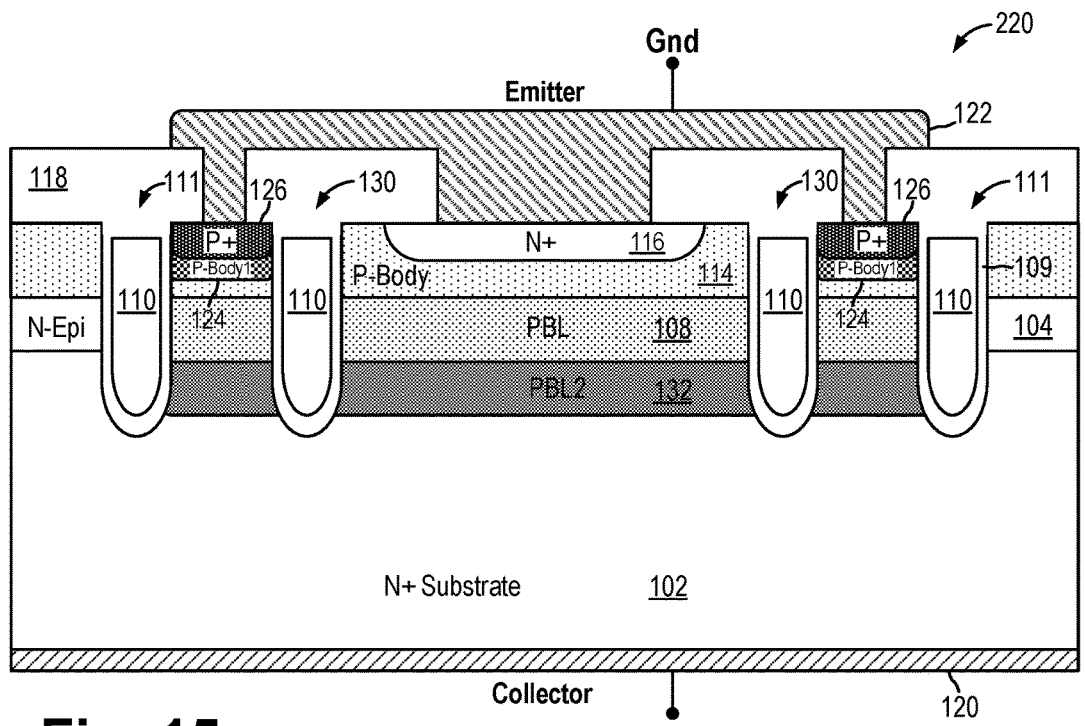
FIG. 15 is a cross-sectional view of a unidirectional TVS device with individually optimized collector-base junction and p-n junction according to a third embodiment of the present invention.

FIG. 15 is a cross-sectional view of a unidirectional TVS device with individually optimized collector-base junction and p-n junction according to a third embodiment of the present invention. FIG. 15 illustrates the construction of the TVS device 50 of FIG. 10 without using a P-type epitaxial layer. Referring to FIG. 15, a unidirectional TVS device 220 ("TVS device 220") is formed on a heavily doped N+ substrate 102. A lightly doped N-type epitaxial layer 104 ("N-Epi layer 104") is formed on the N+ substrate 102. A P-body region 114 is formed in the N-type epitaxial layer 104 above the PBL 108. A heavily doped N+ region 116 is formed in the P-body region 114 to complete the NPN bipolar transistor.

As thus formed, the TVS device 220 is constructed as an NPN bipolar transistor including a collector formed by the N+ substrate 102, a base formed by the P-buried layer 108 and the P-body region 114, and an emitter formed by the N+ region 116. A dielectric layer 118 is formed over the semiconductor structure to cover and protect the semiconductor device. An opening is formed in the dielectric layer 118 and an emitter electrode 122 is formed in the opening for making an ohmic contact with the N+ region 116. A collector electrode 120 for making electrical contact with the N+ substrate 102 is also formed on the backside of the substrate. The emitter electrode 122 and the collector electrode 120 are typically formed of conductive materials, such as metal layers.

In the present illustration, TVS device 220 is isolated by trench isolation structure 111. In the present embodiment, a trench 111 extends to the N+ substrate to isolate TVS device 50 and the trench is lined with an oxide layer 109 and filled with a polysilicon layer 110. In other embodiments, an oxide filled trench isolation structure can be used. In FIG. 15, two trench isolation structures 111 are shown on either side of the TVS device. In actual implementation, the trench isolation structure 111 may be a single trench isolation structure encircling the central portion or the active area of the TVS device.

The TVS device 220 further a heavily doped P+ region 126 formed at the surface of the semiconductor structure and is electrically connected to the emitter potential, such as by connected to the emitter electrode 122 through a contact opening in the dielectric layer 118. In TVS device 220, additional trench isolation structures 130 are used to isolate the P+ region 126 from the active area of the TVS device, as defined by the N+ region 116. Furthermore, in TVS device 220, a buried P-body junction is formed by a P-body 1 region 124 formed in the P-body region 114 and at the junction of the P+ region 126 and the P-body region 114. The P-body 1 region 124 is more heavily doped than the P-body region 114. As thus configured, the NPN bipolar transistor active area is formed between the trench isolation structure 130 and a PN junction diode is formed between the isolation structures 111 and 130. The PN junction diode is formed at the junction between the P-type regions (including P+ region 126, P-body 1 region 124, P-body region 114, and P-buried layer 108) and the N+ substrate 102.

TVS 220 further includes a P-type doped region 132 formed at the junction of the P-type buried layer 108 and the N+ substrate 102. In one embodiment, the P-type doped region 132 is formed as a P-type buried layer region, denoted as PBL2 region. In the present embodiment, TVS device 220 includes a P-type doped region 132 formed at the junction of the P-type buried layer 108 and the N+ substrate 102. In one embodiment, the P-type doped region 132 is formed as a P-type buried layer region, denoted as PBL2 region. The PBL2 132 is more heavily doped than the P-type buried layer 108 and is formed across the entire active area region between the trench isolation structures 111. In the present embodiment, the PBL2 132 is formed at a deeper junction depth than the P-type buried layer 108. The isolation structures 130 extends past the PBL2 layer 132 to isolate the PBL2 layer from the active diode area between the isolation structures 111 and 130. As thus configured, the TVS device 220 includes the PBL2 layer 132 to optimize the collector-base junction of the bipolar transistor and includes P-body 1 region 124 to optimize the p-n junction of the PN junction diode.

Figure 16:
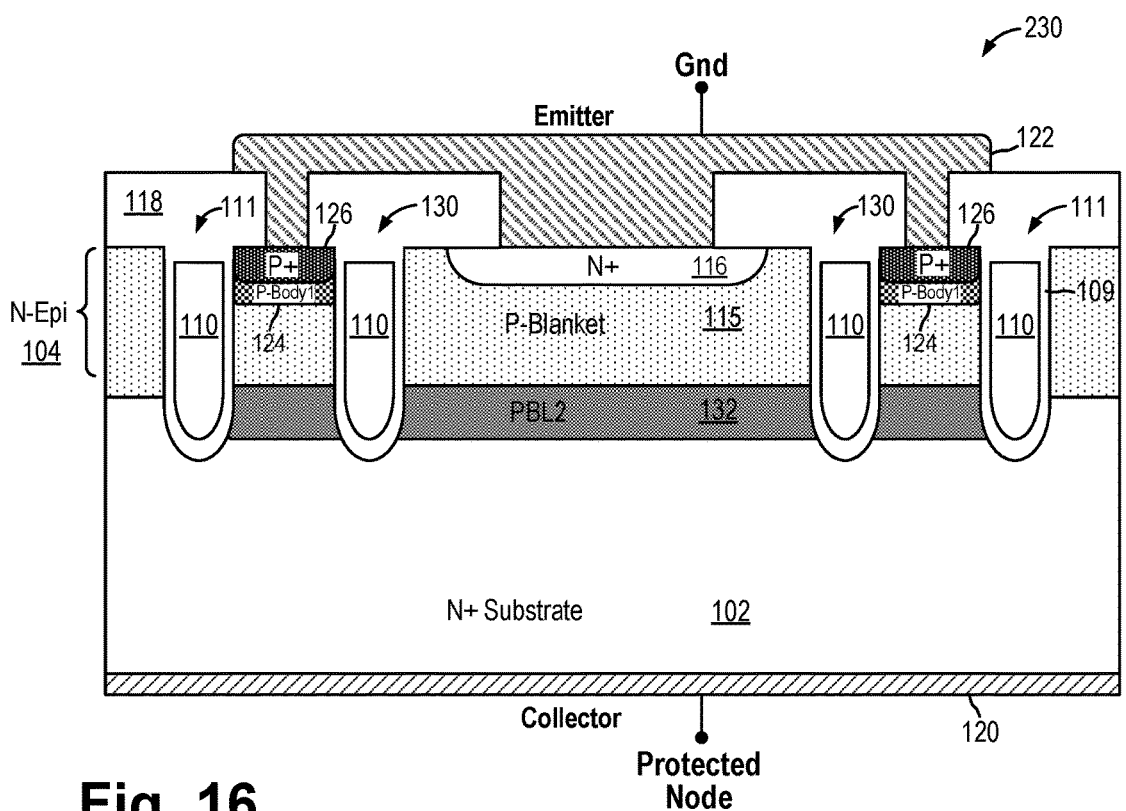
FIG. 16 is a cross-sectional view of a unidirectional TVS device with individually optimized collector-base junction and p-n junction according to a fourth embodiment of the present invention.

FIG. 16 is a cross-sectional view of a unidirectional TVS device with individually optimized collector-base junction and p-n junction according to a fourth embodiment of the present invention. Referring to FIG. 16, a TVS device 230 is constructed in the same manner as the TVS device 220 of FIG. 15 except for the formation of the P-type buried layer and the P-body region. In the TVS device 220 of FIG. 15, separate P-type buried layer 108 and P-body region 114 are formed. In the TVS device 230 of FIG. 16, a blanket P-type layer 115 can be used to replace the separate PBL and P-body layers. The blanket P-type layer 115 is formed on the entire surface of the N-type Epitaxial layer 104. The remaining structures of the TVS device 230 can be formed in the same manner as described above with reference to FIG. 15.

In embodiments of the present invention, the breakdown voltage of the TVS device, unidirectional or bidirectional, can be tuned by adjusting the doping levels of the doped base regions—the P-body region, or the P-body 1 region, or the P-buried layer, or the PBL2 layer. By decreasing the doping levels of the base doping regions, the breakdown voltage of the TVS device increases. In some embodiments, the thickness of the P-type epitaxial layer (if any) can be increased to increase the breakdown voltage.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A bidirectional transient voltage suppressing (TVS) device, comprising:
   a semiconductor substrate of a first conductivity type, the substrate being heavily doped;
   a first epitaxial layer of the first conductivity type formed on the substrate, the first epitaxial layer having a first thickness;
   a second epitaxial layer of a second conductivity type, opposite the first conductivity type, formed on the first epitaxial layer;
   a first buried layer of the first conductivity type and a second buried layer of the second conductivity type formed in the first epitaxial layer extending to the second epitaxial layer, the second buried layer being formed in a central portion of the TVS device, wherein the first buried layer is formed around an outer perimeter adjacent and surrounding the second buried layer;
   a first body region of the second conductivity type formed at a first surface of the second epitaxial layer in the central portion of the TVS device;
   a first heavily doped region of the first conductivity type formed in the first body region at the first surface of the second epitaxial layer; and
   a third buried layer region of the second conductivity type formed in the first epitaxial layer extending from the second buried layer to the semiconductor substrate, the third buried layer region being positioned in the central portion of the TVS device under the first heavily doped region,
   wherein the semiconductor substrate is connected to a first electrode, the first heavily doped region is connected to a second electrode of the TVS device; and
   wherein the semiconductor substrate forms a collector of the TVS device, the second buried layer, the second epitaxial layer and the first body region form a base of the TVS device and the first heavily doped region forms the emitter of the TVS device, the third buried layer region and the semiconductor substrate forming an collector-base junction realizing avalanche mode breakdown.

2. The bidirectional TVS device of claim 1, wherein the second buried layer is formed at a junction depth deeper in the first epitaxial layer than the junction depth of the first buried layer.

3. The bidirectional TVS device of claim 1, wherein the third buried layer region and the semiconductor substrate form a collector-base junction having a first breakdown voltage lower than a breakdown voltage of the junction of the second buried layer and the semiconductor substrate.

4. The bidirectional TVS device of claim 1, further comprising:
   a second body region of the second conductivity type formed at a junction of the first heavily doped region and the first body region, the second body region being more heavily doped than the first body region.

5. The bidirectional TVS device of claim 4, wherein the second body region and the third buried layer region are spatially distributed in a lateral direction in the central portion of the TVS device, the lateral direction being parallel to the first surface of the second epitaxial layer.

6. The bidirectional TVS device of claim 4, wherein the third buried layer region has a doping level selected to optimize a breakdown voltage of the TVS device in a forward zap direction and the second body region has a doping level selected to optimize a blocking voltage of the TVS device in a reverse zap direction.

7. The bidirectional TVS device of claim 4, wherein the third buried layer region comprises a first plurality of islands of doped regions dispersed at a junction of the second buried layer and the semiconductor substrate and the second body region comprises a second plurality of islands of doped regions dispersed at the junction of the first heavily doped region and the first body region, the first plurality of doped regions interleaving the second plurality of doped regions in the lateral direction in the central portion of the TVS device.

8. The bidirectional TVS device of claim 7, wherein the first plurality of doped regions and the second plurality of doped regions are formed in a strip pattern with the first plurality of doped regions and the second plurality of doped regions formed as alternating strips within the central portion of the TVS device.

9. The bidirectional TVS device of claim 7, wherein the first plurality of doped regions and the second plurality of doped regions are formed as concentric circles with the first plurality of doped regions and the second plurality of doped regions formed as alternating circles within the central portion of the TVS device.

10. The bidirectional TVS device of claim 1, further comprising:
a first trench isolation structure formed encircling an active area of the TVS device to provide isolation of the TVS device, the first trench isolation structure comprising a trench formed extending to the first buried layer.

11. The bidirectional TVS device of claim 10, further comprising:
a sinker region of the first conductivity type formed in the active area of the TVS device adjacent the first trench isolation structure, the sinker region extending to the first buried layer; and
a second heavily doped region of the second conductivity type formed at the first surface of the second epitaxial layer and interfacing the sinker region.

12. The bidirectional TVS device of claim 11, further comprising:
a second trench isolation structure formed in the active area of the TVS device and encircling a portion of the active area of the TVS device, the second trench isolation structure being formed between the sinker region and the first heavily doped region, the sinker region being formed between the first trench isolation structure and the second trench isolation structure, wherein the second trench isolation structure comprises a trench formed extending at least into the second epitaxial layer and the second trench isolation structure is separated from the sinker region,
wherein the second trench isolation structure protects the TVS device from lateral injection from the junction between the sinker region and the second heavily doped region.

13. The bidirectional TVS device of claim 11, where in the sinker region and the second heavily doped region are formed a first distance away from the first heavily doped region, the first distance being selected to protect the TVS device from lateral injection from the junction between the sinker region and the second heavily doped region.

14. A transient voltage suppressing (TVS) device, comprising:
a semiconductor substrate of a first conductivity type, the substrate being heavily doped;
a first epitaxial layer of the first conductivity type formed on the substrate, the first epitaxial layer having a first thickness;
a second epitaxial layer of a second conductivity type, opposite the first conductivity type, formed on the first epitaxial layer;
a first buried layer of the first conductivity type and a second buried layer of the second conductivity type formed in the first epitaxial layer extending to the second epitaxial layer, the second buried layer being formed in a central portion of the TVS device, wherein the first buried layer is formed around an outer perimeter adjacent and surrounding the second buried layer;
a first body region of the second conductivity type formed at a first surface of the second epitaxial layer in the central portion of the TVS device;
a first heavily doped region of the first conductivity type formed in the first body region at the first surface of the second epitaxial layer; and
a third buried layer region of the second conductivity type formed in the first epitaxial layer as an island of doped region extending from the second buried layer to the semiconductor substrate, the third buried layer region being positioned in the central portion of the TVS device under the first heavily doped region,
wherein the semiconductor substrate is connected to a first electrode, the first heavily doped region is connected to a second electrode of the TVS device.

15. The TVS device of claim 14, wherein the second buried layer is formed at a junction depth deeper in the first epitaxial layer than the junction depth of the first buried layer.

16. The TVS device of claim 14, wherein the third buried layer region and the semiconductor substrate form a collector-base junction having a first breakdown voltage lower than a breakdown voltage of the junction of the second buried layer and the semiconductor substrate.

17. The TVS device of claim 14, further comprising:
a second body region of the second conductivity type formed at a junction of the first heavily doped region and the first body region, the second body region being more heavily doped than the first body region.

18. The TVS device of claim 17, wherein the second body region and the third buried layer region are spatially distributed in a lateral direction in the central portion of the TVS device, the lateral direction being parallel to the first surface of the second epitaxial layer.

19. The TVS device of claim 17, wherein the third buried layer region has a doping level selected to optimize a breakdown voltage of the TVS device in a forward zap direction and the second body region has a doping level selected to optimize a blocking voltage of the TVS device in a reverse zap direction.

20. The TVS device of claim 14, further comprising:
a first trench isolation structure formed encircling an active area of the TVS device to provide isolation of the TVS device, the first trench isolation structure comprising a trench formed extending to the first buried layer.

21. The TVS device of claim 20, further comprising:
a sinker region of the first conductivity type formed in the active area of the TVS device adjacent the first trench isolation structure, the sinker region extending to the first buried layer; and
a second heavily doped region of the second conductivity type formed at the first surface of the second epitaxial layer and interfacing the sinker region.

22. The TVS device of claim 21, further comprising:
a second trench isolation structure formed in the active area of the TVS device and encircling a portion of the active area of the TVS device, the second trench isolation structure being formed between the sinker region and the first heavily doped region, the sinker region being formed between the first trench isolation structure and the second trench isolation structure, wherein the second trench isolation structure comprises a trench formed extending at least into the second epitaxial layer and the second trench isolation structure is separated from the sinker region,
wherein the second trench isolation structure protects the TVS device from lateral injection from the junction between the sinker region and the second heavily doped region.

23. The TVS device of claim 21, wherein the sinker region and the second heavily doped region are formed a first distance away from the first heavily doped region, the first distance being selected to protect the TVS device from lateral injection from the junction between the sinker region and the second heavily doped region.

24. The TVS device of claim 21, wherein the second heavily doped region of the second conductivity type is electrically connected to the second electrode of the TVS device and the third buried layer region extends to the first buried layer formed around an outer perimeter adjacent and surrounding the second buried layer.

25. The TVS device of claim 21, wherein the second heavily doped region of the second conductivity type is electrically connected to the second electrode of the TVS device and the TVS device further comprises:
- a second body region of the second conductivity type formed at a junction of the second heavily doped region and the first body region, the second body region being more heavily doped than the first body region, the second body region interfacing the sinker region.

26. The TVS device of claim 25, wherein the third buried layer region has a doping level selected to optimize a breakdown voltage of the TVS device in a forward zap direction and the second body region has a doping level selected to optimize a blocking voltage of the TVS device in a reverse zap direction.

27. The TVS device of claim 24, further comprising:
- a second trench isolation structure formed in the active area of the TVS device and encircling a portion of the active area of the TVS device, the second trench isolation structure being formed between the sinker region and the first heavily doped region, the sinker region being formed between the first trench isolation structure and the second trench isolation structure,
- wherein the first trench isolation structure comprises a trench formed extending to portions of the first buried layer and the second trench isolation structure comprises a trench formed extending to other portions of the first buried layer.

28. The TVS device of claim 24, wherein the first buried layer is formed in the first epitaxial layer shallower than a junction depth of the second buried layer.

29. The TVS device of claim 24, wherein the first buried layer is formed extending into the semiconductor substrate.

* * * * *